United States Patent
Hariharan et al.

(10) Patent No.: US 9,067,792 B1
(45) Date of Patent: Jun. 30, 2015

(54) LASER CONVERSION OF HIGH PURITY SILICON POWDER TO DENSIFIED GRANULAR FORMS

(75) Inventors: Alleppey V. Hariharan, Austin, TX (US); Jagannathan Ravi, Bedford, MA (US)

(73) Assignee: Semlux Technologies, Inc., Bedford, MA (US)

( * ) Notice: Subject to any disclaimer, the term of this patent is extended or adjusted under 35 U.S.C. 154(b) by 1425 days.

(21) Appl. No.: 11/982,748

(22) Filed: Nov. 5, 2007

Related U.S. Application Data (60) Provisional application No. 60/856,539, filed on Nov. 3, 2006.

(51) Int. Cl.
*C01B 33/021* (2006.01)
*C01B 33/037* (2006.01)

(52) U.S. Cl.
CPC ............ *C01B 33/021* (2013.01); *C01B 33/037* (2013.01)

(58) Field of Classification Search
CPC .... C01B 33/021; C01B 33/037; C01B 33/039
USPC .............. 219/121.66; 427/596; 423/348–350; 65/29.18; 117/904
See application file for complete search history.

(56) References Cited

U.S. PATENT DOCUMENTS

| | | |
|---|---|---|
| 3,102,061 A | 8/1963 | Thornhill |
| 4,040,848 A | 8/1977 | Greskovich et al. |
| 4,040,849 A | 8/1977 | Greskovich et al. |
| 4,389,967 A | 6/1983 | Shimoda et al. |
| 4,425,408 A | 1/1984 | Levine et al. |
| 4,433,233 A | 2/1984 | Hierholzer et al. |
| 4,637,855 A | 1/1987 | Witter et al. |
| 4,661,335 A * | 4/1987 | Boudot et al. ................ 423/348 |
| 4,668,331 A * | 5/1987 | Ostriker ............................ 117/8 |
| 4,676,412 A | 6/1987 | Tsuchinari et al. |

(Continued)

FOREIGN PATENT DOCUMENTS

| | | | |
|---|---|---|---|
| JP | 11-199382 | | 7/1999 |
| JP | 2002022995 A | * | 1/2002 |

OTHER PUBLICATIONS

Takatori, K. et al., High Pressure Hot-Pressing of Silicon Powders, Journal of the Japan Society of Powder and Powder Metallurgy, 1981, pp. 15-19, vol. 28.

(Continued)

*Primary Examiner* — Anthony J Zimmer
*Assistant Examiner* — Justin Bova
(74) *Attorney, Agent, or Firm* — Pandiscio & Pandiscio (57) ABSTRACT

The present invention relates to a direct method to convert fine and ultra fine silicon powder from polysilicon manufacturing sources such as fluid bed and free space reactors into densified granular forms. This conversion process is effected by the use of lasers of selective wavelengths from solid state diode or optically-pumped YAG sources to locally heat, melt and densify a controlled quantity of silicon powder, and comprises the steps of distributing dry silicon powder on an inert substrate, subjecting the silicon charge to a focused laser beam to realize melted and densified granular forms, and discharging the product. When adapted to high purity silicon powder, the end use for the densified silicon granular forms is primarily as feedstock for silicon-based semiconductor and photovoltaic manufacturing industries. The process, suitably modified, is adaptable to form other silicon body shapes and components.

20 Claims, 11 Drawing Sheets

Densification of Silicon Powder -- A Schematic

(56) References Cited

U.S. PATENT DOCUMENTS

| | | | |
|---|---|---|---|
| 4,759,887 A * | 7/1988 | Geissler et al. | 264/414 |
| 4,788,049 A | 11/1988 | Long et al. | |
| 5,069,740 A | 12/1991 | Levine et al. | |
| 5,073,358 A | 12/1991 | Shimizu et al. | |
| 5,334,540 A * | 8/1994 | Ishii | 324/754.23 |
| 5,431,127 A | 7/1995 | Stevens et al. | |
| 5,556,791 A * | 9/1996 | Stevens et al. | 438/63 |
| 5,817,173 A | 10/1998 | Nakata | |
| 6,632,689 B2 | 10/2003 | Martin et al. | |
| 6,727,308 B2 | 4/2004 | Kniess et al. | |
| 7,175,685 B1 | 2/2007 | Hariharan et al. | |
| 2003/0226820 A1 * | 12/2003 | Khang | 216/54 |
| 2004/0250764 A1 | 12/2004 | Nagano et al. | |
| 2007/0014682 A1 | 1/2007 | Hariharan et al. | |

OTHER PUBLICATIONS

Santana, C.J. et al., The effects of processing conditions on the density and microstructure of hot-pressed silicon powder, Journal of Materials Science, 1996, pp. 4985-4990, vol. 31.

Nakata, Josuke, Sphereiacl Solar Cells Solve Issue of 3-D Sunlight Reception, Asia Electronics Industry, 2003, pp. 45-48.

Minemoto, T. et al., Spherical silicon solar cells fabricated by high speed dropping method, 2005, pp. 963-966.

Liu, Z. et al., Improvement of the Production Yield of Spherical Si by Optimization of the Seeding Technique in the Dropping Method, Japanese Journal of Applied Physics, 2007, pp. 5695-5700, vol. 46, No. 9A.

Boyd, Ian W., Laser-Enhanced Oxication of Si, Appl. Phys. Lett., 1983, pp. 728-730.

Das, Prodip K. et al., Liquid-Water-Droplet Adhesion-Force Measurements on Fresh and Aged Fuel-Cell Gas-Diffusion Layers, Journal of the Electrochemical Society, 2012, pp. B489-B496.

Diana, Antoine et al., Sessile Drop Wettability in Normal and Reduced Gravity, Microgravity Sci. Technol., 2012, vol. 24, pp. 195-202.

Lautrup, Benny, Surface Tension. Physics of Continuous Matter, http://www.cns.gatech.edu/~predrag/courses/PHYS-4421-10/Lautrup/surface.pdf.

Liu, Jing et al., Numerical Studies of Sessile Droplet Shape With Moving Contact Lines, Micro and Nanosystems, 2011, vol. 3, No. 1.

Liu, Yung S. et al., Rapid Oxidation via Adsorption of Oxygen in Laser-Induced Amorphous Silicon, Appl. Phys. Lett., 1981, pp. 1005-1007.

Rhim, Won-Kyu et al., Thermophysical Properties of Molten Silicon Measured by the JPL High Temperature Electrostatic Levitator, Jet Propulsion Laboroaty, California Institute of Technology, Feb. 1999.

* cited by examiner

FIGURE 1. Optical Absorption Coefficient of Silicon as a function of the wavelength of the incident radiation

FIGURE 2. Laser Process Scheme Flow sheet

Silicon Powder Feed to Process Substrate

Controlled Powder Build-up on Substrate

Laser Processing

Silicon Densification

Formed Solid Ejection

FIGURE 3. Densification of Silicon Powder -- A Schematic

FIGURE 4. Simplified Laser Process System for forming Silicon granules

FIGURE 5.  Typical Powder Feeder for Silicon Powder

Pear-shaped Granule     Near-Spherical Granule     Spherical Granule

FIGURE 6. Typical Silicon Product Granule Shapes – Some Examples

FIGURE 7. Typical Multistation Rotary Indexing Process Platform for Laser processing Silicon powder into small melted and densified granules.

FIGURE 8. Typical Multistation X-Y Indexing Process Platform for Laser processing Silicon powder into small melted and densified granules.

FIGURE 9. Typical Multistation X-Y Indexing Process Platform (with V shaped grooves) for Laser processing Silicon powder into small melted and densified granules.

| Irregular | Spheres | Blocks | Discs |
| Chunk, Lump | Pellets | Cuboids | Wafers |
| | Cylinders | | |

FIGURE 10. Typical Silicon Product Shapes – Some Examples

FIGURE 11. Simplified Laser Process System for forming Silicon Shapes

LASER CONVERSION OF HIGH PURITY SILICON POWDER TO DENSIFIED GRANULAR FORMS

REFERENCE TO PENDING PRIOR PATENT APPLICATION

This patent application claims benefit of prior U.S. Provisional Patent Application Ser. No. 60/856,539, filed Nov. 3, 2006 by Alleppey V. Hariharan et al. for LASER CONVERSION OF HIGH PURITY SILICON POWDER TO DENSIFIED SHAPES, which patent application is hereby incorporated herein by reference.

FIELD OF INVENTION

The present invention is directed towards conversion of fine and ultra fine silicon powder into densified granular forms. This conversion process is achieved by the use of lasers to melt and densify the silicon powder fed into the process system. The densified granular forms may then be used as, among other things, feedstock for silicon-based semiconductor and photovoltaic manufacturing industries.

BACKGROUND OF THE INVENTION

The photovoltaic (PV) industry continues and is projected to have significant growth amidst the environment of fossil fuel supply uncertainties, concerns over global warming, difficulties of energy transport from distant centralized facilities, gradual yet steady improvements in PV module prices, re-evaluation of true costs for alternate energy in decentralized locations and other such factors.

Silicon is the main material resource for making solar cells and will remain so for a long time. The projected growth of the PV industry is singularly hampered by the lack of silicon feedstock material for the PV industry. While dedicated solar grade polysilicon plants are currently in production, or under construction, significant shortfall of silicon feedstock material is still expected in the foreseeable future. Many of the solar grade silicon manufacturing processes currently in use produce very significant quantities of high purity silicon powder as a by-product. However, despite the high purity of the silicon powder, this silicon powder by-product is presently very difficult to use, as will hereinafter be discussed in further detail.

More particularly, ultra fine silicon powder is currently a by-product of two major processes.

(1) the Fluid Bed Process to Manufacture High Purity Electronic or PV Grade Polysilicon.

In this process, silicon is deposited by heterogeneous thermal decomposition of silane ($SiH_4$) gas or chlorosilane ($SiCl_xH_y$, where y=4−x) gas on granules of silicon seed particles. The granules grow in size from an initial seed size of ~0.2 mm to, typically, 1 mm in diameter. The granules are then utilized in silicon melting and crystal growth applications.

As stated above, the fluid bed process also results in the production of a large quantity of ultra fine silicon powder (or dust). More particularly, of the total amount of material produced by the fluid bed process, approximately 15% to 20% is ultra fine silicon powder. The particle sizes of such ultra fine silicon powder vary over wide ranges, but are typically in the range of approximately 0.1 microns to 20 microns in diameter. This powder is of high purity, but cannot currently be recycled or used in silicon melting and crystal growth applications because of the fineness of the powder.

More particularly, the powder produced by the fluid bed process is so fine that it becomes extremely difficult to handle. Among other things, the very fine silicon powder goes airborne easily, making it extremely difficult to transfer from location to location and making it hard to create "clean" (i.e., particle free) and inert atmosphere conditions by vacuum processes. In addition, the fineness of the powder creates significant maintenance problems for equipment. Furthermore, the fineness of the powder creates safety issues, since the powder can be explosive, in much the same way that corn dust may be explosive in a silo.

Accordingly, the very fine silicon powder created by the fluid bed process is tapped out of the reactor outlet as process waste.

(2) Ultra Fine Silicon Powder is the Primary Product from Free Space Reactors which are being Developed to Manufacture High Purity Electronic or PV Grade Polysilicon.

In this process, silicon powder is formed in the gas phase by homogeneous decomposition of silane ($SiH_4$) gas or trichlorosilane ($SiHCl_3$) gas at high temperatures. The particle size of such formed silicon powder is typically in the sub-microns range. The purity of the silicon powder produced by the free space reactor process is very high when used with high purity electronic or PV grade silane or trichlorosilane gas and when performed in suitable reactors. However, the ultra fine nature of the silicon powder prevents its direct use in silicon melting and crystal growth applications. This is because the fineness of the silicon powder creates the same transfer, "clean" and inert atmosphere, maintenance and safety issues discussed above with respect to the fluid bed process. Since the entire silicon production from the free space reactor process is in the form of such silicon powder, it needs to be processed and converted into larger forms for use by the PV industry.

A few methods have been attempted to convert ultra fine silicon powder (e.g., such as that produced by the two processes recited above) to larger forms so that they can be productively used as feedstock in manufacturing operations (e.g., such as silicon melting and crystal growth applications).

Granulation and augmentation of the silicon powder particle size by electron beam melting or microwave heating to 1200° C. to 1500° C. are described in Japanese Patent 11199382JP. Such procedures are mainly for making silicon nitride and other silicon compounds and are not applicable to the high purity silicon granules needed for the PV industry.

Typical powder metallurgical process schemes have been suggested to convert silicon powder into larger aggregates to make them useable in various applications. They include compacting with a typical organic binding agent such as starch and lignin.

High-pressure densification and hot pressing of silicon powder, with or without sintering aids, are described in J. Materials Sci. 31 (18), 4985-4990 (1996); J. Jap. Soc. Powder Metal. 28 (1)15-19 (1981); U.S. Pat. No. 4,040,848, and U.S. Pat. No. 4,040,849.

Dry compaction of high purity silicon powder without the use of binders is described in U.S. Pat. No. 7,175,685, but the compacted material does not have the strength and integrity needed for subsequent uses.

Compaction, using selected high purity inorganic or organic binders, with subsequent debinding and densification by high temperature sintering of pressed silicon bodies, in order to realize an industrially viable process and robust product, is described in U.S. patent application Ser. No. 11/479,735 (U.S. Patent Application Publication No. 2007/0014682).

Several procedures to make crystalline silicon spheres are described in various literatures. These procedures include:

shotting of molten silicon through a nozzle or orifice as described in Asia Electronics Industry, p 45, February 2003, IEEE Vol. 31, p 963 (2005) and Jap. J. Appl. Phys. Vol. 46, p 5695 (2007); processing a paste of silicon deposited on a substrate and furnace melting the paste as described in U.S. Pat. No. 4,637,855; coating the silicon particles with an oxide skin layer, melting and coalescing the silicon into spheres within the oxide skin and further processes as described in U.S. Pat. Nos. 4,425,408, 5,069,740, 5,431,127 and 5,556,791, and other variations of such techniques as described in U.S. Pat. No. 5,817,173. Such silicon spheres, intended for spheral solar cells, are in the sub-millimeter to one millimeter diameter range. These processes are typically followed by some sequence of other processes to remove contaminations and cause crystallization, all of which make them inherently complicated for direct application.

Where it becomes necessary to maintain or improve the level of purity of the silicon powder for PV feedstock usage, application of conventional processes such as direct melting, powder compaction, sintering and densification, etc., or methods to form silicon spheres, create considerable complexity and associated costs, and in practice result in incorporation of unwanted impurities into the silicon.

In spite of the various above-mentioned proposals, there are currently no prior art industrially-practical and cost-effective methodologies available to directly convert silicon powders to high density granular forms which (i) maintain the purity and quality of the polysilicon powder by-product, (ii) are reproducible in a large-scale manufacturing environment, and (iii) may be transported and used without form failure and without the need for additional processes for subsequent product uses.

Accordingly, it is an object of the present invention to provide a robust process for the conversion of high purity silicon powder to high value densified granular forms which can be directly used by the PV feedstock industries to grow silicon crystals.

Laser-based processes are currently being developed in the realm of rapid tooling and rapid prototyping for use with metal powders. These processes include laser-assisted metal processes (LAMP), laser forming processes (LASFORM), solid freeform fabrication processes (SFF), shape deposition manufacturing processes (SDM), selective laser sintering processes (SLS) and laser engineered net shaping processes (LENS). Both $CO_2$ and Nd-YAG lasers are utilized for such applications. A variety of metal powders, such as stainless steel, bronze, titanium, aluminum, copper and INVAR have been processed to make from small to complex net-shaped articles for industrial use. Additionally, high power laser systems are also being utilized for metal forming operations such as cutting, drilling, welding, micromachining, etc. Many such laser systems concentrate power through fiber optic and other focusing aids. High power solid state lasers are utilized for several such applications. They can be used on a continuous wave (CW), quasi-CW or pulsed mode depending on the application.

However, it is believed that, heretofore, no one has considered using lasers to convert high purity silicon powder to silicon granules and thereby to render this powder into viable feedstock.

Figure 1:
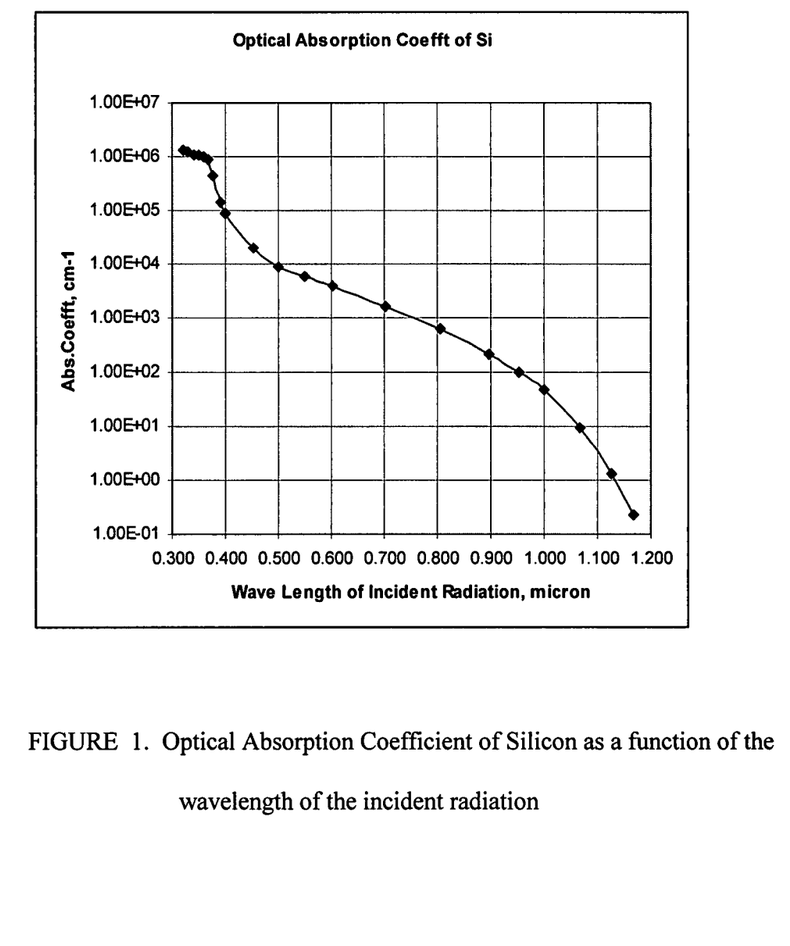
FIG. 1 illustrates the optical absorption coefficient of silicon as a function of the wavelength of incident radiation, in the range 0.3 microns to 1.2 microns.

Elemental silicon is uniquely positioned to utilize laser processing schemes. The optical absorption of elemental silicon increases exponentially when the incident radiation has wavelengths shorter than one (1) micrometer. This is illustrated in FIG. 1, where the optical absorption coefficient of silicon is plotted against the incident wavelength of the radiation.

The optical data for selected incident radiations are shown in Table 1. The optical absorption of silicon powder is expected to be a little higher than that of a polished wafer. Efficient absorption of short wavelength radiation will cause the silicon to heat and finally melt. See Table 1.

Several existing types of lasers have lasing wavelengths that can be applicable for processing silicon. These laser types include, for example, optically-pumped lasers of wavelengths slightly over 1 μm based on matrices of yttrium aluminum garnet (Nd:YAG, Yb:YAG), yttrium orthvanadate (Nd:YVO4) and lithium yttrium fluoride (Nd:LiYF4). However, the efficiencies of these lasers are below 30%. Because of their low efficiencies, their long wavelengths where silicon absorption is poor, and their high cost, these lasers are not ideal for melting of silicon powder on an industrial scale.

Diode lasers are also becoming more feasible for silicon processing, with larger power lasers becoming available. At the near infrared lasing wavelengths, very high power conversion efficiencies of greater than 65% have been achieved, since these devices are directly energized and electrically activated, rather than being optically pumped. The diode lasers utilizing gallium-arsenide (GaAs) and indium gallium arsenide (InGaAs), in the 940 nm to 980 nm range, which are used for optically pumping Yb:YAG or Yb:glass lasers, would themselves be highly efficient energy sources for silicon heating and melting.

SUMMARY OF THE INVENTION

It is, therefore, an object of the present invention to provide a viable and practical process and technology to convert silicon powder into a form, typically melted and densified granular shapes, that can be easily manufactured, transported and utilized to produce silicon feedstock for other applications.

It is a further object of the present invention to provide a process and technology that will maintain the purity of the silicon granule at substantially the same level as, or even better than, the starting silicon powder.

It is another object of the present invention to provide a method of locally melting and densifying a controlled quantity of silicon powder into granular shapes.

It is yet another object of the present invention to provide a system and facility for conducting a powder-to-densified granular shape conversion at a commercially useful production rate, such as high speed melting and densification, and processing in the order of a kilogram or more of silicon powder per hour per process unit.

One of the most important aspects of the present invention is the development of a direct process that, when used with silicon powder of high purity, adds significant form and value to the material, and provides feedstock for the electronic or photovoltaic industries.

Hence, another object of the present invention is to produce, from silicon powder, dense forms (such as granules) of sufficiently high purity that can be used directly for the production of solar cells by methods such as ribbon or EFG crystal growth processes, without the need for additional large volume melting and crushing operations.

The process of the present invention generally uses selective laser wavelengths and energies to locally heat, melt and densify small charges of the silicon powder into granular shapes.

In one embodiment of the present invention, a charge of dry silicon powder is submitted to appropriate laser radiation, such as the primary and/or frequency-doubled wavelengths from direct semiconductor diode lasers or pumped solid state lasers, such as Yb:YAG, Yb doped glass, Nd:YAG, Nd:YVO$_4$, etc., to cause the silicon to heat and finally melt. If the charge is appropriately located on an inert substrate or in a recess formed in or on the inert substrate, the silicon melt coalesces into a regular or irregular granular shape. If the melting occurs on a dynamically forming silicon granule, the new melt incorporates into the silicon granule, becomes part of it and the granule grows in size. By appropriate combination of the substrate shape, amount of silicon powder charge, melt location, and laser power intensity and duration, a continuous larger size silicon body of regular or irregular shape, such as spherical or pear shaped granules, etc., can be realized.

The operation of conveying the silicon powder to the laser beam and locally melting the powder as described above is done in an inert and controlled atmosphere environment that will prevent oxidation, nitridation or carburization of the silicon at the high process temperatures. In addition, the in-process melting of the silicon powder can also favorably enhance the purity of the densified compact product through the selective vaporization and removal of specific impurities. Such purification will result from vaporization of silicon monoxide, SiO, thus reducing the oxygen impurity typically present in high surface area silicon powder, and by removal of other volatile metal impurities. Reductions of impurity levels of selective elements by a factor of 10 to 100 are feasible.

The powder processing system and machinery can be semi-automatic or automated for control of operation. The entire process facility of silicon powder handling, transport, and laser process systems will be within a controlled ingress and filtered egress facility for environmental safety.

It is the combination of the ability to convert silicon powder into densified granular shapes and in-process conservation of, or even improvement in, the purity level of the densified product silicon that enables subsequent value-added use of the silicon powder, especially high purity silicon powder, for example to critical uses such as feedstock materials for electronic and photovoltaic applications. The purity level of the silicon material feedstock for photovoltaic applications should be >99.99%.

In one form of the present invention, there is provided a method for converting small amounts of high purity silicon powder into melted and densified granules of polysilicon for use as silicon feedstock, the method comprising:

(a) providing a dry source of high purity silicon powder;

(b) feeding a controlled amount of dry silicon powder onto a process substrate;

(c) thermally treating the dry silicon powder with a laser heat source so as to cause local melting and densification of the silicon powder into granular form;

(d) discharging the silicon granules from the process substrate; and (e) repeating steps (a) through (d) so as to produce a sufficient quantity of silicon granules.

In an additional form of the present invention, there is provided a silicon granule consisting of melted and densified silicon powder and devoid of a binder, the silicon granules obtained by a method comprising feeding a controlled amount of dry silicon powder into a process substrate; and thermally treating the dry silicon powder on the process substrate with a laser heat source so as to cause local melting and densification of the silicon powder into granular form.

In another form of the present invention, there is provided apparatus for converting high purity silicon powder to densified silicon granules, the apparatus comprising:

a process substrate;

apparatus for distributing a controlled amount of the high purity silicon powder on the process substrate; and a laser assembly for directing a laser beam on a selected region of the process, whereby the laser beam causes the silicon powder in that selected region to melt and densify into densified silicon granules.

In an additional form of the present invention, there is provided silicon granules for use as silicon feedstock to the photovoltaic and semiconductor industries for making silicon crystals, the silicon granules comprising melted and densified high-purity silicon powder, the granules being non-spherical.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts, and further wherein.

DETAILED DESCRIPTION OF THE PREFERRED EMBODIMENTS

As shown in FIG. 1, silicon has excellent absorption characteristics for optical radiation between the ultraviolet and visible wavelengths, and the absorption tapers off to negligible levels in the near infrared wavelength (i.e., >1.2 μm) range. Solid state lasers such as Yb:YAG and Nd:YAG lasers typically have lasing wavelengths around 1 μm and can be effective in melting silicon powder. Diode lasers, which typically operate in the wavelength range of 970 nm, are more effective than solid state lasers in melting silicon, from both efficiency and energy absorption considerations. Silicon energy absorption leading to melting is even more effective if the wavelengths are shifted into the visible or UV regions of the optical spectrum, either by means of frequency doubling or by use of new lasers which are currently being developed.

Figure 2:
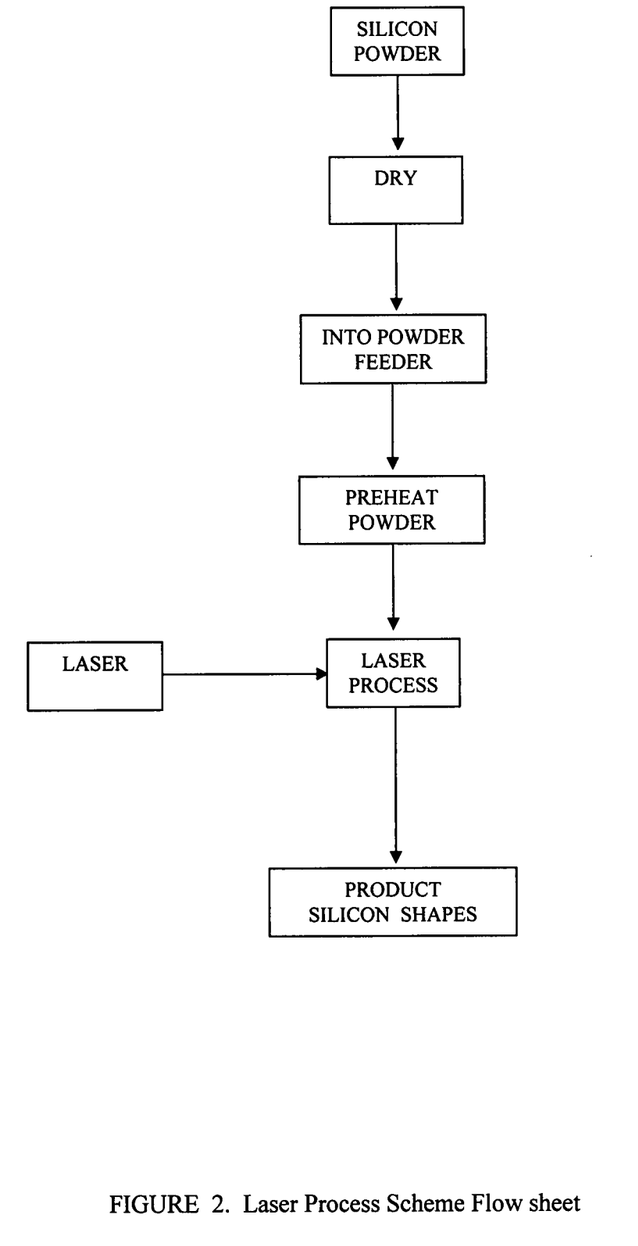
FIG. 2 shows a typical flow sheet for the laser process scheme of the present invention.

A process flow sheet of converting silicon powder to densified silicon shapes (e.g., granules) is disclosed in FIG. 2.

Figure 3:
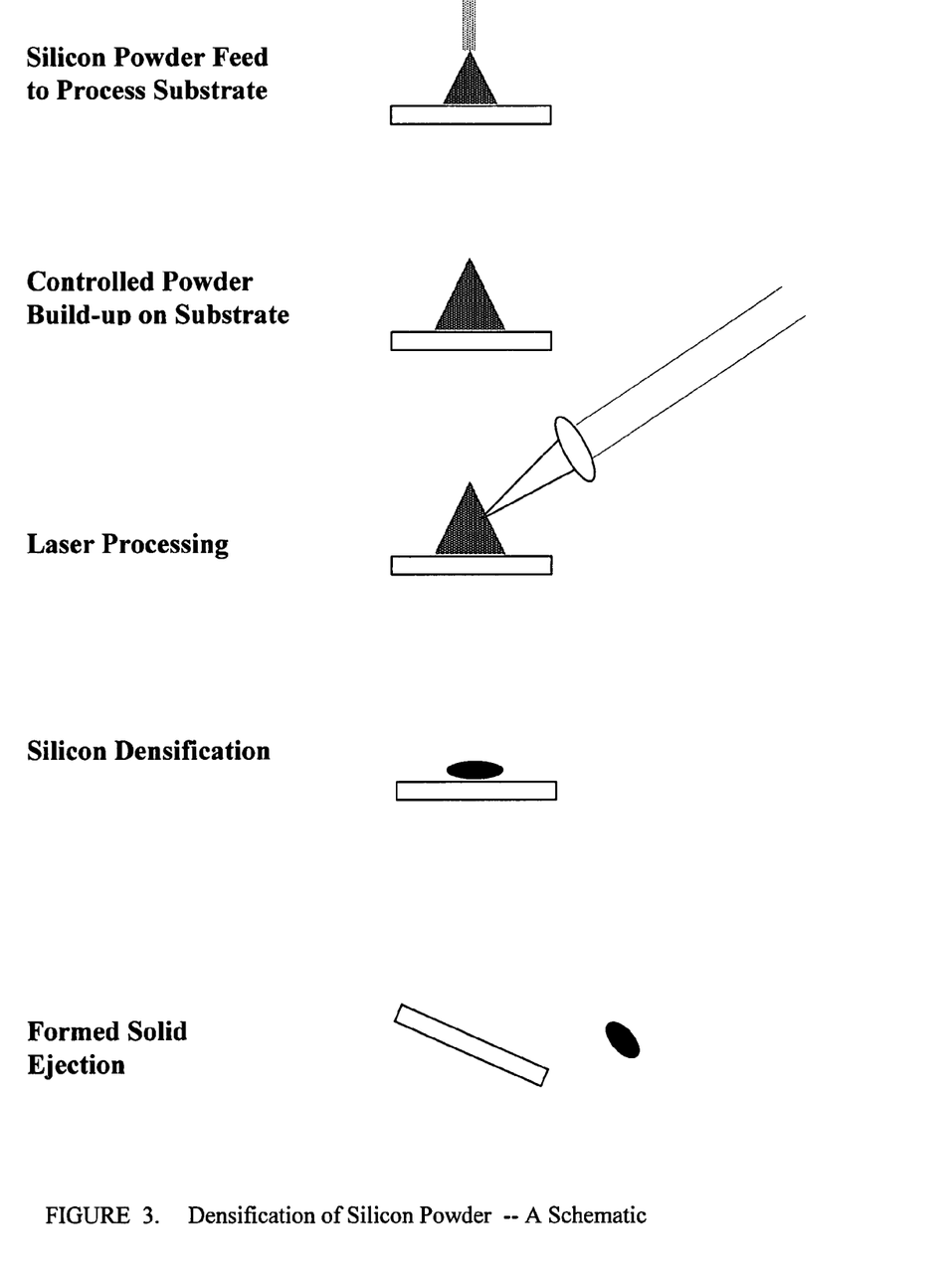
FIG. 3 is a schematic illustration of the process for densifying the silicon powder.

FIG. 3 shows a schematic of the processes involved in the densification of silicon powder into silicon granules.

Figure 4:
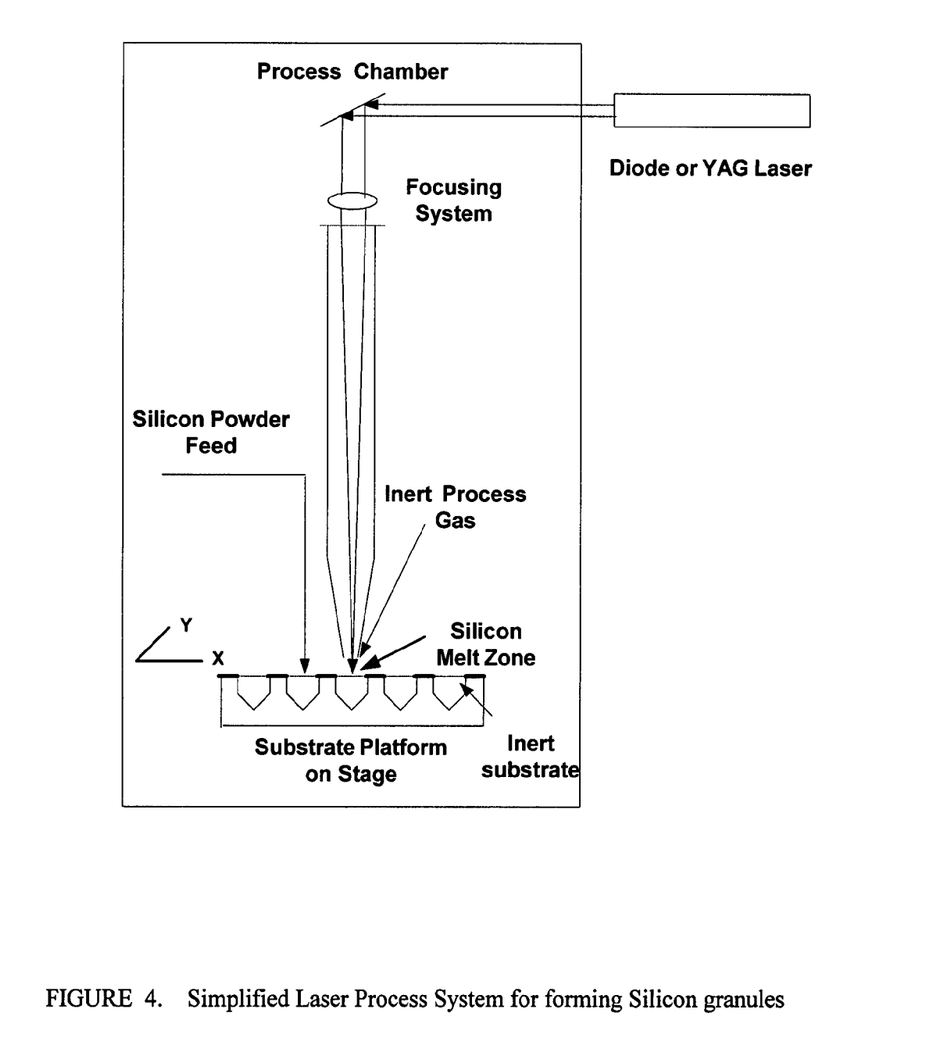
FIG. 4 is a simplified laser process system for forming silicon granules in accordance with the present invention.

A simplified laser process system for silicon powder processing into granules is described in FIG. 4.

More particularly, the basic steps of a preferred method for making high purity densified and robust silicon granules is as follows. First, the ultra fine silicon powder is transferred into a drying system, where the powder is dried at a temperature of between 100° C. and 150° C., and preferably at ~100° C., to remove absorbed and adsorbed water and other environmental impurities and improve powder flowability. Drying may be effected by methods such as radiant, microwave or laser heating. The apparatus where the silicon powder resides or flows through during the drying operation is configured appropriately. It is important to note that the silicon powder does not have to be dried before it moves through the powder feeder, however, this step is preferred in order to ensure the highest purity in the final product (i.e., the silicon granules).

The silicon powder may also be fed into the laser process system at ambient temperatures.

Figure 5:
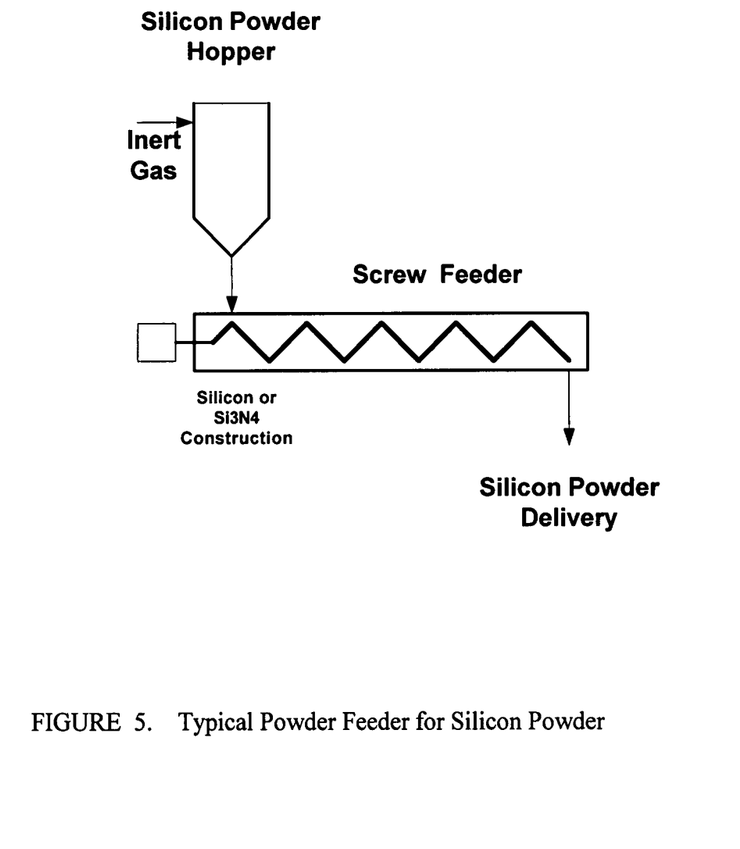
FIG. 5 is a powder feeder for silicon powder which can be used with the process of the present invention.

After the foregoing (optional) drying step, the dried powder is conveyed to a feed hopper attached to a powder feeder system (FIG. 5). This feed hopper and powder feeder system will feed a defined and controlled amount, by weight or by volume, of the silicon powder per unit process time to a laser process system such as the one shown in FIG. 4. The amount of silicon powder conveyed into the laser process system is determined by, among other things, the size and energy of the laser beam(s) impinging on the powder.

Figure 6:
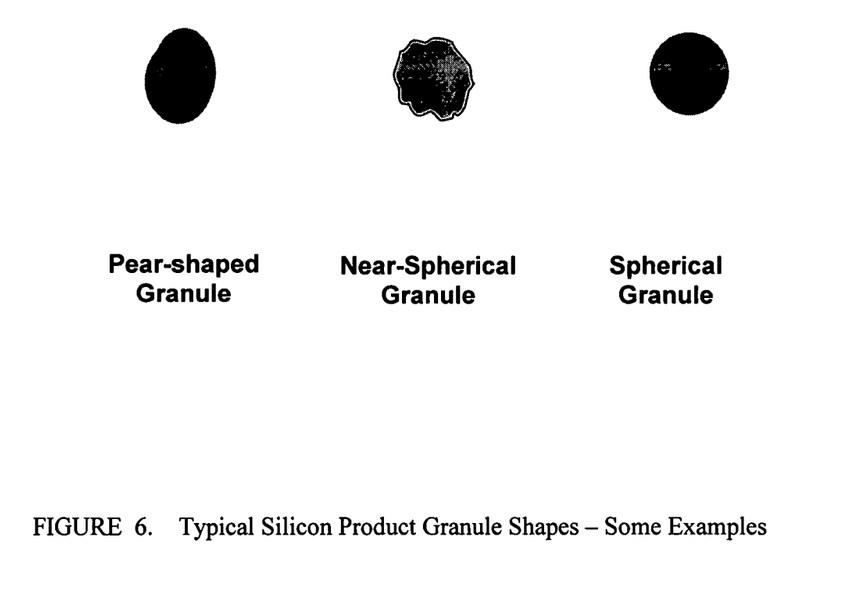
FIG. 6 illustrates examples of silicon product granule shapes produced in accordance with the present invention.

The laser process system (FIG. 4) comprises (i) a process substrate of appropriate design, (ii) a focused beam of laser radiation, with a wavelength preferably in the ultraviolet to near infrared ranges, (iii) appropriate inert gas for protection against unwanted chemical reactions (e.g., oxidation), and (iv) auxiliary cooling systems. The laser beam will cause the silicon charge to locally heat and melt as is, or locally heat, melt and fuse with the forming silicon granule. The melt typically coalesces to form either a pear-shaped, a near spherical granule or a spherical granule (see FIG. 6) that solidifies when the laser heat is removed. The laser beam can be used either as a continuous wave (CW) form, modulated CW or pulsed form, depending on the particle size and the initial form of the silicon powder. The choice and methodology used is based on effective heat transfer into the silicon particles and overall heating of the silicon body.

Although the above description of the invention is directed to the use of a laser to locally heat the silicon powder to a temperature higher than 1412° C. (i.e., above the melting point of silicon) so that the powder melts into granules, for cost considerations, it is important to note that the silicon powder may also be pre-heated by auxiliary sources prior to utilizing laser heating for the rapid fusing and melting of the powder. These auxiliary sources may include laser, radiant, microwave, or induction heating to high temperatures (e.g., from hundreds of degrees Celsius up to the melting point of silicon, i.e., 1412° C.).

By design, the components of the process systems of the present invention are of sufficient quality to handle high purity materials. For example, the substrate platform may be made of high purity silicon, fused quartz, silicon-nitride, silicon-nitride coated silicon-carbide, boron-nitride, or boron-nitride coated graphite. The choice of such substrates is to be on the basis of minimized wetting by the silicon melt during the laser-effected thermal process.

Appropriate gases, e.g., inert gases, may include high purity helium, argon, etc., and are preferably mixed with hydrogen to reduce or prevent oxidation, nitridation or carburization of the silicon powder and formed granules. When the inert gases are mixed with hydrogen, the hydrogen content may comprise 1% to 10% by volume, and preferably comprises 5% by volume. Performing the granulation process under a controlled, inert gas environment prevents contamination from ambient gases and ensures high purity of the process.

Special high purity powder feeders may be required. These may be rotary screw feeders, vibratory feeders, disc feeders, fluidized bed feeders, etc. In such powder feeders, the materials which contact the silicon powder are preferably made of high purity silicon or silicon-nitride.

The silicon powder itself is conveyed from the hopper to the process platform (i.e., the substrate platform) either by gravity flow or with the aid of a transporting inert gas or with a mechanical transport system, etc.

The density of the silicon powder on the substrate may be increased for more efficient processing. This may be achieved by vibration, tamping or by means of electrostatic charging of the powder feed.

The invention is amenable to many embodiments. In a preferred embodiment, the present invention utilizes fine silicon powder having a particle size in the range of about 0.01 microns to about 500 microns, and preferably a particle size in the range of 0.1 microns to about 100 microns, and a mean particle size in the range of about 0.1 microns to about 50 microns, and preferably a mean particle size in the range of about 0.5 microns to about 10 microns. The present invention preferably converts the fine silicon powder into granules approximately 2 mm in diameter.

In one preferred embodiment, the fine silicon powder has a bulk density in the range of approximately 0.1 g/cc to approximately 0.6 g/cc, and preferably has a bulk density in the range of approximately 0.2 glee to approximately 0.4 g/cc.

In accordance with the present invention, the fine silicon powder may be a by-product from the fluid bed reactors, the free space reactors or other silicon process reactors that manufacture feedstock quality silicon for the PV industries. Also in accordance with the present invention, the fine silicon powder may be a by-product from the crushing of silicon chunks or recovered from the wafer processing and ingot shaping in the semiconductor and/or PV industries. In a preferred embodiment, the silicon powder consists of substantially pure silicon particles.

The specific size and shape of the densified silicon granules is generally not critical for substantially all end-use applications, since the granules will be used as feedstock and re-melted during the subsequent end-use application. All that is generally required is that the densified silicon granules have a size and shape which is conducive to easy handling, e.g., a mass substantial enough to prevent the granules from becoming airborne, a size which facilitates transport by typical material handling systems (e.g., bins and hoppers, screw-feeders, etc.), and an integrity to permit the granules to be transported without breaking down.

In the process of the present invention, preferably, a quantity by weight, or by volume, of the silicon powder is fed into the specific substrate platform and locally heated and melted by the focused laser beam to achieve the desired dimensions. The powder melts under the laser beam and solidifies to granules of varying dimensions, with the size of the granules depending on, among other things, the power, duration and area of the laser beam. The melted shape is then ejected from the machine through a take-off system.

The ejection of the formed solid silicon pieces for collection can be achieved by various means such as vibration or tapping. Mechanical or electromechanical devices, including solenoids or piezoelectric actuators, can be used to effect such means.

The substrate may have a flat surface and the silicon powder may lie on the top surface of the substrate during processing. Alternatively, and more preferably, the substrate may be designed with a series of recesses (e.g., grooves, wells, etc., with or without tapered bottoms) and filled with silicon powder to a certain depth. The powder melts under the laser beam and solidifies to granules of varying dimensions, depending on, among other things, the power, duration and area of the laser beam, and also on the size of the recesses.

The size and shape of the recesses in the substrate may be varied depending on the desired granule dimensions. The recesses may have a flat bottom or may have a tapered shape to collect the silicon granule during and after melting. The tapered recesses may have a cross-section which is v-shaped or u-shaped or otherwise tapered and, where the recesses are wells, the tapered recesses may have a bottom shape which is conical, hemispherical or otherwise tapered. The recesses may also have any other shape which would produce the desired granule characteristics.

It should be appreciated that the recesses may be formed as openings extending into the depth of the substrate or by receptacles disposed on the top surface of the substrate.

Figure 7:
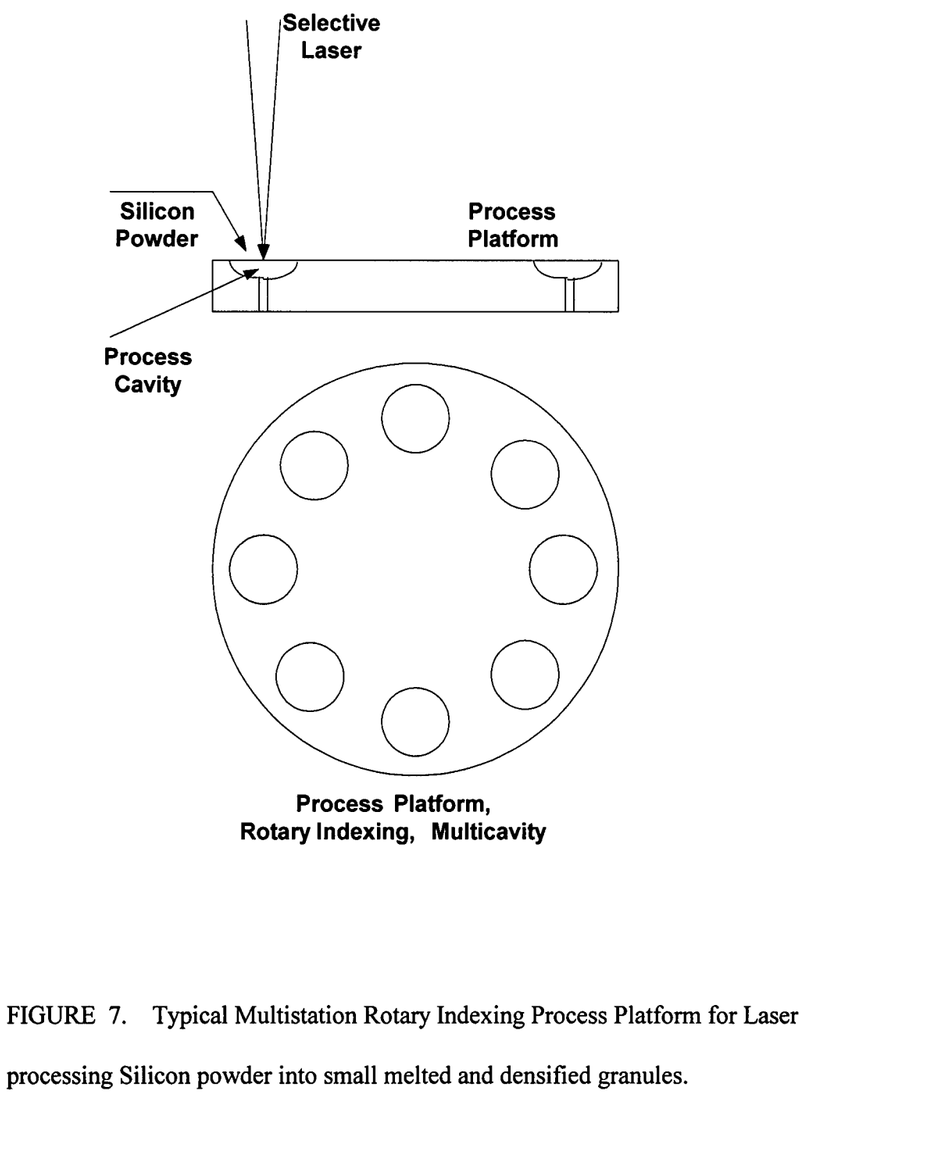
FIG. 7 is a schematic illustration of a multi-station, rotary-indexing process platform for the laser processing of silicon powder into small melted and densified granules in accordance with the present invention.
Figure 8:
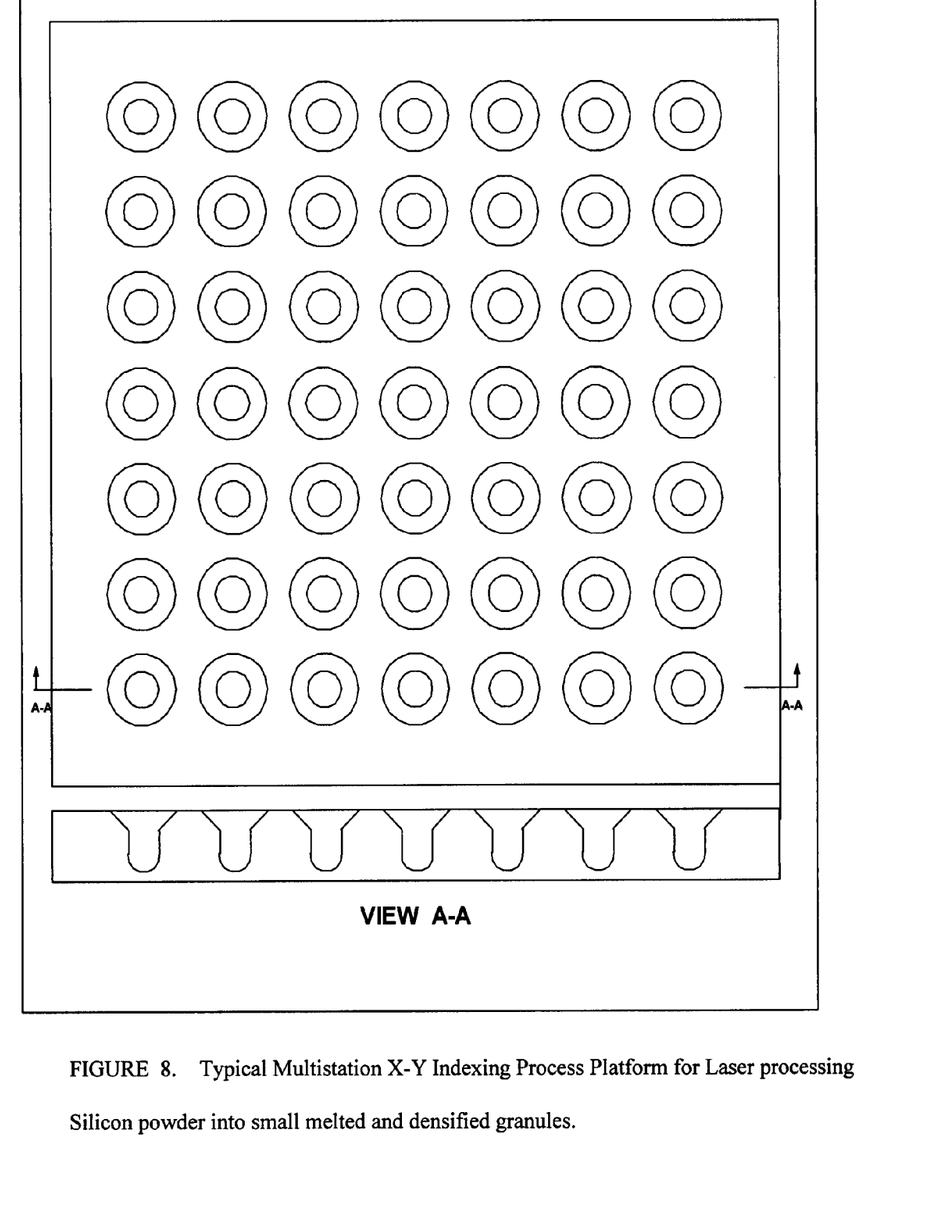
FIG. 8 is a schematic view of a multi-station X-Y indexing process platform for laser processing silicon powder into small melted and densified granules in accordance with the present invention.
Figure 9:
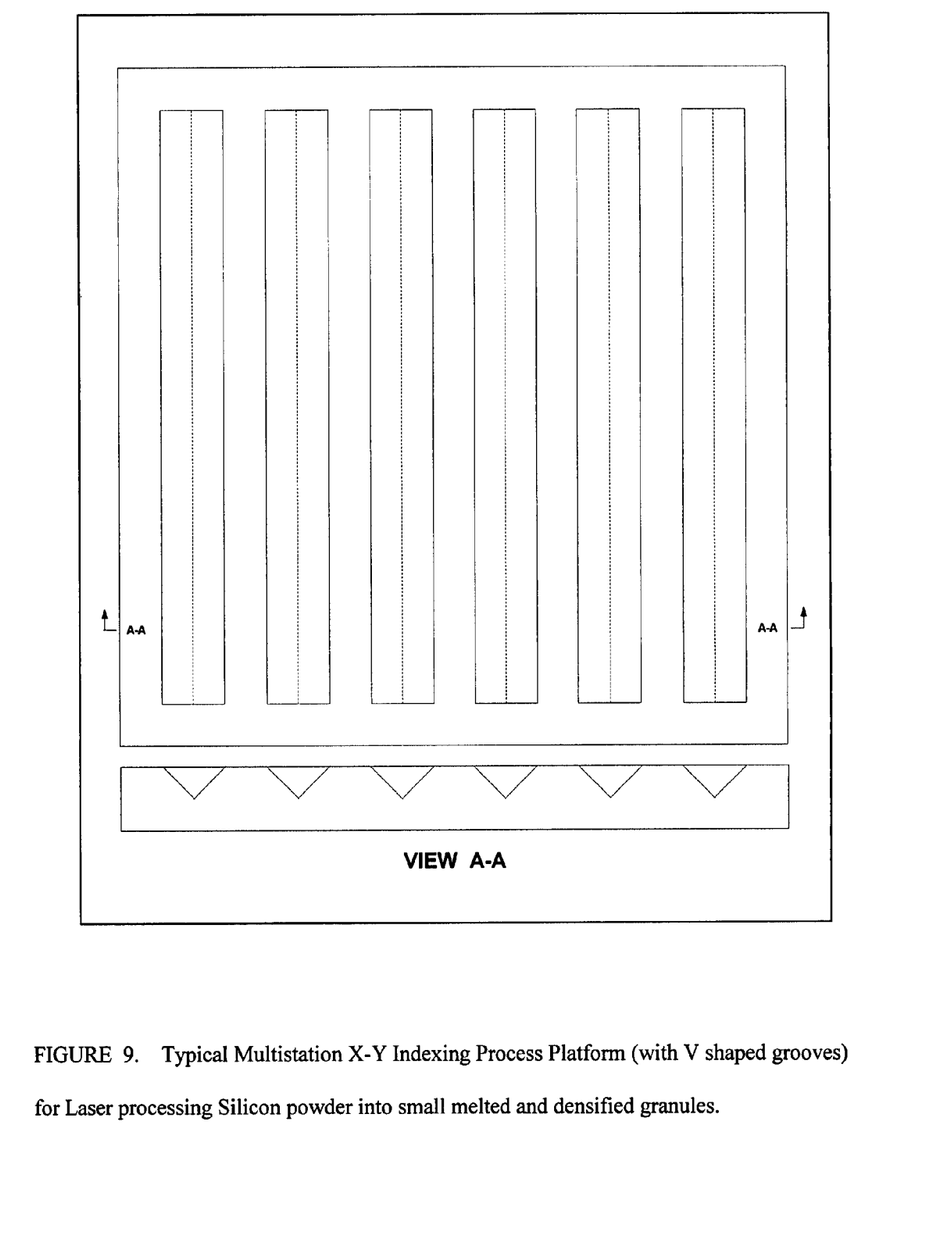
FIG. 9 is another schematic view illustrating an X-Y indexing process platform (with V-shaped grooves) for laser processing silicon powder into small melted and densified granules.

By way of example but not limitation, the multi-station process platforms shown in FIGS. 7 through 9 (i.e., rotary indexing process platforms, X-Y indexing process platforms, etc.) may be used for laser processing silicon powder into small melted and densified granules.

The process efficiency can be increased by scanning or oscillating the laser beam to cover more of the powder surface area on the substrate. The laser beam movement may be achieved by electro-optical means.

The machinery may be configured to operate multiple lines of laser processors (e.g., by using multiple lasers or multiple beams split from individual lasers) to meet high volume requirements. Such machinery shall also be located within the confines of an inert gas (e.g., argon) chamber to generally confine the silicon powder and the process, and ensure clean oxygen-free and moisture-free thermal processing.

The present invention provides for the utilization of the melted and densified silicon granules as direct feed material for different industries. More particularly, densified silicon granules of high purity (i.e., >99% and preferably >99.99%) may be used as polysilicon feedstock in semiconductor and photovoltaic materials industries to make high purity silicon crystals. In addition, densified silicon granules of nominal purity may be used for auxiliary ferrosilicon, aluminosilicon and other alloy manufacturing operations.

In one embodiment of the present invention, the silicon granules have a diameter in the range of about 1 millimeter to about 5 millimeters, and preferably about 2 millimeters.

In one embodiment, the granules produced by the process of the present invention have a density of greater than approximately 80% of the theoretical density of elemental silicon and have a weight within the range of approximately 1 milligram to approximately 30 milligrams.

In one embodiment of the present invention, the silicon granules have a weight of approximately 10 milligrams.

In another embodiment of the present invention, the silicon granules have a weight within the range of approximately 0.1 milligrams to approximately 150 milligrams.

As a consequence of the localized heating and melting of the silicon powder on the substrate with a directed laser energy source, the granules produced in accordance with the present invention may have regular and irregular spherical shapes. Specifically, the silicon granules may also have a "pigtail" feature appended to the body of the granule.

High purity silicon crystals may be made from the densified silicon granules in ways which are known in the art of crystal growth. Some of the crystal growth processes include methods such as Czochralski (CZ), edge defined film growth (EFG), heat exchanger method (HEM), directional solidification system (DSS), etc.

There is a further particular advantage of the process of the present invention. Continuous crystal growing methods confer technical and economic benefits. In fact, some methods (such as EFG) already use or require continuous feed where the silicon is in granular form or composed of small pieces from crushed silicon chunks. Using the process of the present invention, small size solid silicon pieces, such as granules of regular or irregular shapes, can be directly made. These silicon pieces may then be used as polysilicon feedstock for continuous crystal growth operations.

VARIATIONS OF THE INVENTION

Figure 10:
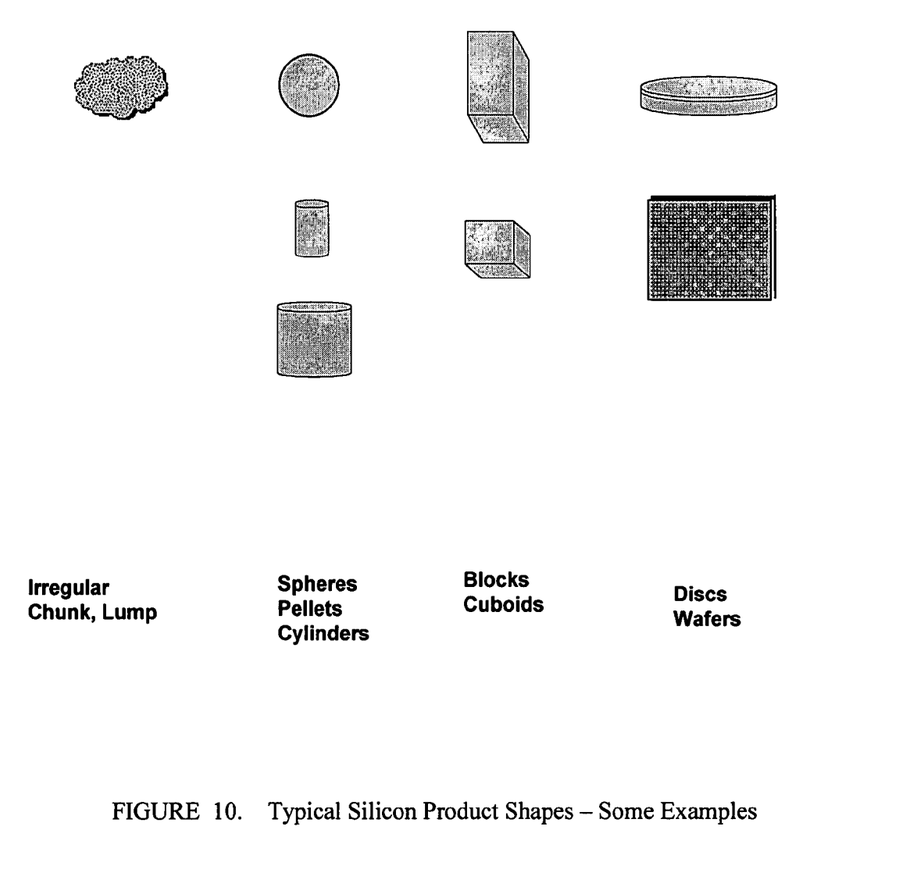
FIG. 10 illustrates examples of typical silicon product shapes formed in accordance with the present invention.

Although the process descriptions of the present invention pertain to forming silicon granules, it is equally applicable to form other densified shapes of silicon. If the silicon powder feed and melting occurs on a dynamically forming silicon shape, the new melt incorporates into the silicon shape and becomes part of it. By appropriate combination of silicon powder feed, substrate shape, melt location and, and laser power intensity and duration, a continuous silicon body shape can be realized. The term "densified shape" as used herein is inclusive of any form factor and is a descriptive term that implies a compacted small volume of the material. Its shape includes irregular and regular granules, and may include irregular chunk, lump, etc., or regular spheres, cylindrical shapes, squares, rectangular blocks, disks, flats, slabs, wafers, etc. (FIG. 10), and sizes that are practical for process machinery and handling.

Although intended primarily to use high purity silicon powder as it is manufactured (either with or without the pre-drying and pre-heating steps) as feed for the laser melting and forming process, the invention is equally applicable to process silicon compacts made with selective high purity binders. When binders are utilized, the intermediate feed material shape, formed in auxiliary equipment, may be as cylindrical pellets, spherical granules, blocks, etc. Such shapes, when processed with the laser system, will initially lose the binders by evaporation, and then lead to melting into the desired final shapes. The process will also require the environment of the silicon compact to be efficiently purged with inert gases to remove all traces of the binder material from the silicon prior to the silicon melting step.

Figure 11:
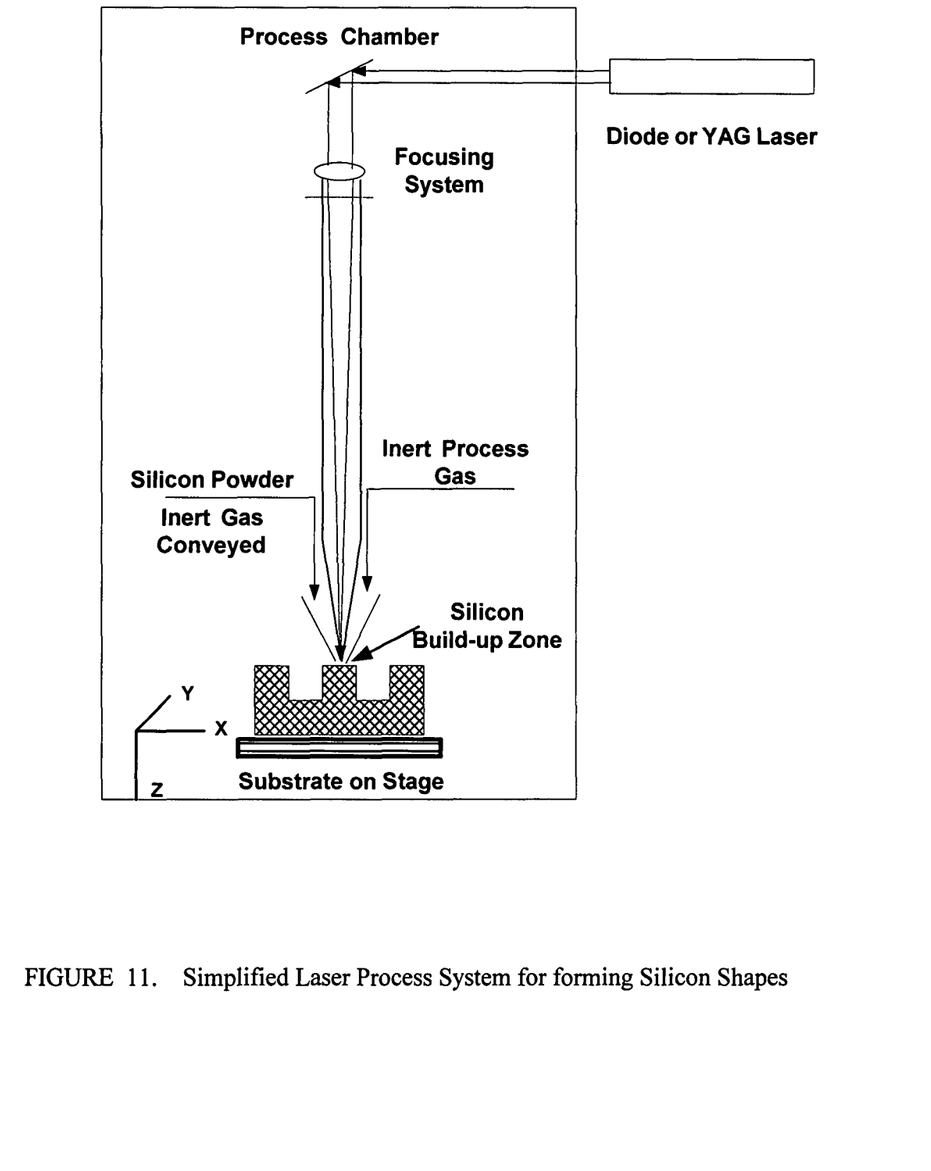
FIG. 11 is a simplified laser process system for forming silicon shapes in accordance with the present invention.

The laser forming method as described in this invention, and suitably modified to form shaping, is also amenable to make specific components of the type typically used in the semiconductor process industries, such as wafer carriers, wafer supports, RTP/EPI rings, susceptors and plasma etch chamber components, etc. A typical process platform for laser processing silicon powder into such shaped articles is shown in FIG. 11.

EXAMPLE 1

High purity silicon powder with particle size in the range of 0.1 microns to 3 microns, and with mean diameter of 0.5 microns, was utilized. The bulk density of the powder was 0.3 grams per cubic centimeter, and which tapped to a density of 0.5 grams per cubic centimeter. A high purity semiconductor grade graphite block with drilled chambers approximately 5 mm in diameter and 6 mm in depth, and coated with boron nitride was used as the substrate. The silicon powder was placed in the holes and tamped. An IPG Photonics YLR-1700 Yb:YAG laser was used. The laser setup utilized a focus of 150 mm, 60 mm collimator and 100 microns diameter fiber with defocused beam just below the focal plane. An argon cover gas was used around the process area to prevent oxidation. When using a laser power of 85 W CW, and with an approximate beam spot size of 4 mm to 5 mm, for 5 to 6 seconds, the silicon charge melted, coalesced and formed a granule in the bottom of the chamber. The granule sizes varied in the range of 2 mm to 3 mm diameter in various trials.

In another series of trials, when the laser was used for 3 to 4 seconds instead of the 5 to 6 seconds discussed above, the resulting granule sizes varied in the range of 1 mm to 2 mm diameter.

Several sets of granules with diameters in the range of 1 mm to 3 mm were made.

EXAMPLE 2

The high purity silicon powder of Example 1, and a second supply of high purity silicon powder with a particle size in the range of 0.1 microns to 20 microns, and a mean diameter of 1 micron, was used. The bulk density of the powder of the second supply was 0.4 grams per cubic centimeter and the tap density was >0.5 grams per cubic centimeter. The substrate was a high purity h-boron nitride block having drilled conical chambers approximately 10 mm in diameter and 6 mm in depth, and with hemispherical bottoms which taper into approximately 5 mm in diameter, similar to the platform shown in FIG. 8. The silicon powder was distributed on the substrate and tamped into the chambers.

An IPG Photonics diode laser DLR-175 was utilized. The laser setup utilized a focus of 230 mm, 50 mm collimator and 400 microns diameter fiber, and the beam was defocused to provide a large spot of heat. Two off-axis inert argon gas jets, leading and trailing the laser beam, were used to protect the silicon charge from oxidation.

Two procedures were utilized. In one, the powder lumps were scanned under a fixed beam of diode laser at a rate of 2 mm per second. The laser power was 65 W. Granules in the range 1 mm to 2 mm formed at the bottom of the pits.

In the second procedure, the diode laser was aimed at each powder lump in the multicavity substrate for 5 seconds, and then the substrate was indexed to process the next lump. The laser power was 65 W. Granules in the range 2 mm to 3 mm formed at the bottom of the pits.

Several sets of granules with diameters in the range of 1 mm to 3 mm were made using the two sources of silicon powder.

MODIFICATIONS

Other and various embodiments will be evident to those skilled in the art, from the descriptions, figures and claims provided herein. Numerous other changes, modifications and revisions in the apparatus and process will occur to those skilled in the art in view of the present disclosure. Thus, the following appended claims should not be strictly construed to their expressed terms, but should be broadly construed in a manner consistent with the spirit, breadth and scope of the inventors' contribution to the process and equipment described herein.

What is claimed is:

1. A method for converting high purity silicon powder into a polysilicon granule of a desired size and of a desired shape, the method comprising:
   (a) providing a dry source of high purity silicon powder;
   (b) providing a process substrate comprising a recess having a defined size and shape, the defined size and shape being the size and shape required to form the polysilicon granule of the desired size and the desired shape;
   (c) feeding a selected amount of dry silicon powder into the recess of the process substrate, the selected amount of dry silicon powder being the amount required to form the polysilicon granule of the desired size and the desired shape;
   (d) heating the dry silicon powder disposed in the recess with a laser emitting light at a wavelength in the range of ultraviolet to near infrared for a selected time and at a selected power so as to cause local melting, densification and solidification, whereby to form a polysilicon granule of the desired size and the desired shape, wherein the polysilicon granule has a diameter greater than about 2 mm and less than 5 mm; and
   (e) discharging the polysilicon granule from the process substrate.

2. The method according to claim 1, wherein the silicon powder comprises a particle size in the range of 0.01 µm to 500 µm, and a mean particle size in the range of 0.1 µm to 50 µm.

3. The method according to claim 1, wherein the silicon powder has a bulk density within a range of about 0.1 g/cc to about 0.6 g/cc.

4. The method according to claim 1, wherein the process substrate is fabricated from an inert and refractory material.

5. The method according to claim 4 wherein the inert and refractory material is selected from the group consisting of high purity silicon, fused quartz, silicon-nitride, silicon-nitride coated silicon-carbide, boron-nitride and boron-nitride coated graphite.

6. The method according to claim 1, wherein the process substrate comprises a plurality of recesses.

7. The method according to claim 6, wherein the plurality of recesses comprise at least one from the group consisting of grooves and wells.

8. The method according to claim 6, wherein the plurality of recesses have a tapered shape to collect the silicon granule after melting.

9. The method according to claim 8, wherein the recesses have a cross-section which comprises at least one from the group consisting of flat, v-shaped, u-shaped, conical and hemispherical.

10. The method according to claim 1 wherein the laser comprises a solid state diode laser.

11. The method according to claim 1 wherein the laser comprises an optically-pumped laser.

12. The method according to claim 1, wherein the laser emits light at a wavelength in the range of 200 nm to 1100 nm.

13. The method according to claim 1, wherein the silicon powder is pre-heated in the recess in the process substrate to a temperature less than 1412° C. prior to the granulation process so as to economize and accelerate the granulation process.

14. The method according to claim 13, wherein the heat source for pre-heating the silicon powder is selected from the group consisting of radiant, microwave, induction and laser heating.

15. The method according to claim 1, wherein said step of heating comprises applying a temperature higher than 1412° C. to the silicon powder.

16. The method for making silicon granules by a laser process according to claim 1, wherein the method is performed in a controlled atmosphere gas environment.

17. The method of claim 16 wherein the controlled atmosphere gas environment comprises at least one selected from the group consisting of inert helium and argon gas.

18. The method of claim 16 wherein the controlled atmosphere gas environment is mixed with hydrogen gas, with the content of hydrogen gas in the controlled atmosphere gas environment being 1% by volume to 10% by volume.

19. The method according to claim 10, wherein the diode laser emits light at a wavelength in the range of 940 nm to 980 nm.

20. The method according to claim 1 wherein the desired size and the desired shape of the polysilicon granule is defined by at least one selected from the group consisting of the recess in the process substrate, the amount of dry silicon powder in the recess in the process substrate and the amount of energy delivered by the laser to the silicon powder.

* * * * *